United States Patent
Sunwoo et al.

(10) Patent No.: US 7,844,773 B2
(45) Date of Patent: Nov. 30, 2010

(54) REFRESH CIRCUIT AND REFRESH METHOD IN SEMICONDUCTOR MEMORY DEVICE

(75) Inventors: Jung Sunwoo, Seoul (KR); Yun-Sang Lee, Yongin-si (KR); Hoe-Ju Chung, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 914 days.

(21) Appl. No.: 11/730,275

(22) Filed: Mar. 30, 2007

(65) Prior Publication Data
US 2008/0080285 A1    Apr. 3, 2008

(30) Foreign Application Priority Data
Sep. 28, 2006    (KR) .................. 10-2006-0094704

(51) Int. Cl.
G06F 12/00    (2006.01)

(52) U.S. Cl. .................. 711/106; 365/222; 365/236; 365/230.03; 711/5

(58) Field of Classification Search .................. 711/5, 711/105, 106; 365/230.03, 236, 222, 189.07
See application file for complete search history.

(56) References Cited

U.S. PATENT DOCUMENTS 6,104,648 A * 8/2000 Ooishi .................. 365/200
7,082,072 B2 * 7/2006 Dono et al. .................. 365/222

* cited by examiner

*Primary Examiner*—Jasmine Song
(74) *Attorney, Agent, or Firm*—Harness, Dickey & Pierce, P.L.C.

(57) ABSTRACT

A refresh method for a semiconductor memory device having more than one bank group is provided. The refresh method may include applying an all-refresh command to one the bank groups, determining if one of the bank groups includes a bank undergoing a refresh operation when the all-refresh command is received, and performing an all-refresh operation based on the determination.

16 Claims, 5 Drawing Sheets

REFRESH CIRCUIT AND REFRESH METHOD IN SEMICONDUCTOR MEMORY DEVICE

PRIORITY STATEMENT

This U.S. nonprovisional patent application claims priority under 35 U.S.C. §119 of Korean Patent Application 10-2006-0094704 filed on Sep. 28, 2006, the entire contents of which is hereby incorporated by reference.

BACKGROUND

1. Field

Example embodiments relate to semiconductor memory devices, and more particularly, to refresh methods and refresh circuits, which may be included in a semiconductor memory device having a bank group.

2. Description of Related Art

A Dynamic Random Access Memory (DRAM), which may be included in various semiconductor memory devices, requires a refresh operation to maintain data stored therein. Conventionally, a DRAM having a bank group includes a refresh counter for each bank group and the bank groups operate independently of each other.

In a DRAM having a bank group, a refresh operation may be classified into three different categories referred to herein as a bank refresh, a bank group refresh and an all-refresh.

A bank refresh is used herein to refer to a refresh performed for a specific bank requiring a refresh. A bank group refresh is used herein to refer to a refresh performed for a specific bank group requiring a refresh. The bank refresh and the bank group refresh have in common the characteristic of performing a refresh only when a specific bank and specific bank group, respectively, require refreshing.

Meanwhile, an all-refresh is a refresh performed for all of bank groups included in a DRAM. A counter allocated to a bank group may be used in an all-refresh. Further, in the all-refresh, a refresh in each bank group is performed in the same manner as a refresh in a preceding bank group.

FIG. 1 is a block diagram illustrating a semiconductor memory device having a conventional bank group. In FIG. 1, a plurality of conventional bank groups BG0, BG1, BG2 and BG3 and a conventional peripheral circuit 10 are shown.

Although there are four conventional bank groups BG0, BG1, BG2 and BG3 shown in FIG. 1, the number of the bank groups may vary. Each of the bank groups may include a plurality of banks. For example, the bank group BG0 shown in FIG. 1 includes banks bank01, bank02, bank03 and bank04, and the bank group BG1 includes banks bank11, bank12, bank13 and bank14. Likewise, the bank group BG2 includes banks bank21, bank22, bank23 and bank24, and the bank group BG3 includes banks bank31, bank32, bank33 and bank34. The number of banks in each bank group may vary.

The conventional peripheral circuit 10 may include circuits used and/or required for operation of a semiconductor memory device having the plurality of bank groups, for example, various drivers, circuits required for input/output of data, etc.

As described above, a refresh may be classified into three categories including bank refresh, bank group refresh and all-refresh. The bank group refresh may be used in a conventional semiconductor memory device having a structure including four banks as shown in FIG. 1. An all-refresh operation, which may be used in the conventional semiconductor memory device shown in FIG. 1, includes a bank group refresh operation that is performed for each of the bank groups of a device. Each of the bank group refresh operations performed in an all-refresh operation requires a refresh interval as further explained below with reference to FIG. 2.

FIG. 2 illustrates a refresh timing diagram of a conventional semiconductor memory device having the configuration shown in FIG. 1. In FIG. 2, a bank group refresh command is applied to the conventional semiconductor memory device, and then, an all-refresh command is applied to the conventional semiconductor memory device.

Referring to FIG. 2, a bank group refresh command Fg is applied to the first bank group BG0 of the semiconductor memory device and a bank group refresh operation is performed for the first bank group BG0. To perform the refresh of the first bank group BG0 in response to the bank group refresh command Fg, a bank group refresh time tFg is required.

Still referring to FIG. 2, after the bank group refresh command Fg is applied to the first bank group BG0 and the bank group refresh operation is performed on the first bank group BG0, an all-refresh command Fa is applied after a time duration equal to or greater than the group refresh time tFg. As such, there should be a time duration equal to or greater than the bank group refresh time tFg between the bank group refresh command Fg and the all-refresh command Fa. In other words, an all-refresh operation triggered in response to an all-refresh command cannot begin while one of the bank groups of a conventional semiconductor memory device is undergoing a bank group refresh.

The timing diagram in FIG. 2 also illustrates internal commands int_Fg_BG0, int_Fg_BG1, int_Fg_BG2 and int_Fg_BG3 of a conventional semiconductor memory device. As shown by the first internal command int_Fg_BG0 of the applied bank group refresh command Fg, a bank group refresh command Fg is applied and then after a given time tFg, an active command Act is applied to the first bank group BG0 and the first bank group BG0 is refreshed. As shown in FIG. 2, the group refresh time includes a tRAS_Fg time duration and Precharge time duration tRPg. The beginning of the Precharge time duration may be triggered by a group precharge command Pg as shown in FIG. 2.

In light of the above, applying all-refresh command Fa to the conventional semiconductor memory device can only trigger an all-refresh operation to begin immediately if the conventional semiconductor device does not include a bank group currently undergoing a bank group refresh operation. Further, in a conventional semiconductor memory device, if an all-refresh command Fa is received, the performance of the all-refresh operation always begins with a bank group refresh of the first bank group BG0 and proceeds sequentially performing bank group refresh operation on the remaining bank groups BG1, BG2 and BG3.

SUMMARY

Example embodiments provide a refresh circuit and refresh method for use in a semiconductor memory device. The refresh circuit and refresh method is capable of improving a refresh time characteristics of a semiconductor memory device in a situation in which a bank group refresh command is applied to the semiconductor memory device and then an all-refresh command is applied. An operating speed drop of the semiconductor memory device or loss of data, etc. caused by the refresh time increase may be improved, and a bus efficiency drop within the semiconductor memory may be improved.

An example embodiment provides a refresh method in a semiconductor memory device including a plurality of bank groups each having a plurality of banks. The method may include applying an all-refresh command to one of the plurality of bank groups, determining if the one of the plurality of bank groups includes a bank undergoing a refresh operation, and performing an all-refresh operation that is based on the determining in response to the applied all-refresh command.

According to an example embodiment, performing the all-refresh operation may include beginning the all-refresh operation with a bank group refresh of the one of the plurality of bank groups if the determining determines the one of the plurality of bank groups does not include the bank undergoing the refresh operation, and beginning the all-refresh operation with a bank group refresh of a bank group different from the one of the plurality of bank groups if the determining determines the one of the plurality of bank groups does include the bank undergoing the refresh operation.

According to an example embodiment, the determining may include storing information of the bank group including the bank undergoing the refresh, and comparing the stored information with information of the one of the plurality of bank groups to which the all-refresh command is applied. As such, in this example embodiment, the performing begins the all-refresh operation with the bank group refresh of the one of the plurality of bank groups if the stored information does not match the information of the one of the plurality of bank groups to which the all-refresh command is applied, and begins the all-refresh command with the bank group refresh of a bank group different from the one of the plurality of bank groups if the stored information matches the information of the one of the plurality of bank groups to which the all-refresh command is applied.

According to an example embodiment, the refresh method may further include storing information of a bank group that undergoes a final refresh. The stored information of the bank group may be an address of the bank group.

An example embodiment provides a refresh circuit of a semiconductor memory device including a plurality of bank groups each having a plurality of banks. The refresh circuit includes a refresh counter and a refresh counter controller. The refresh counter has a value corresponding to each of the plurality of bank groups, and the refresh counter controller controls the refresh counter to maintain a value or increase the value of the refresh counter after each refresh command.

According to an example embodiment, the refresh counter controller may include a bank group comparator comparing first bank group information of a bank group including a bank undergoing a refresh operation with second bank group information of a bank group identified with an all-refresh command.

According to an example embodiment, the refresh circuit performs an all refresh operation. The all refresh operation begins with a bank group refresh of a bank group different from the bank group identified with the all-refresh command if a comparison result of the bank group comparator indicates the first bank group information matches the second bank group information, and the all refresh operation begins with a bank group refresh of a bank group not identified in the all-refresh command if the comparison result of the bank group comparator indicates the first bank group information matches the second bank group information.

According to an example embodiment, the a refresh counter controller may further include a bank group refresh counter for increasing a value of the refresh counter if the comparison result of the bank group comparator indicates the first group information matches the second group information.

According to an example embodiment, the refresh counter controller may also include a bank group information storing unit for storing information of the bank group including the bank undergoing the refresh operation. The bank group information storing unit may also store information of a bank group undergoing a final refresh in the all-refresh operation.

Another example embodiment provides a refresh method of a semiconductor memory device having a plurality of bank groups each having a plurality of banks. The refresh method may include applying a first command and a first address to designate a bank to which the first command is applied; storing the first address; executing the first command for a bank designated by the first address; applying a second command and a second address to designate a bank to which the second command is applied; comparing whether the first address is equal to the second address; executing the second command when not equal to each other in the comparison result; and operating a bank group refresh counter when equal to each other in the comparison result, and changing a counter bit, and then executing the second command for its corresponding bank group.

According to an example embodiment, the refresh method of the semiconductor memory device may further include storing a counter bit and a bank group address after changing the counter bit. The first command may be a refresh command for at least one bank of the plurality of banks, and the first command may be a refresh command for the one bank group. The second command may be a refresh command for all bank groups. The second address may be an address of bank group initially undergoing a refresh from among the plurality of bank groups.

BRIEF DESCRIPTION OF THE DRAWINGS

The foregoing and other features and advantages of example embodiments will be apparent from a review of the detailed description of example embodiments that refers to the drawings in which.

DETAILED DESCRIPTION OF EXAMPLE EMBODIMENTS

Figure 1:
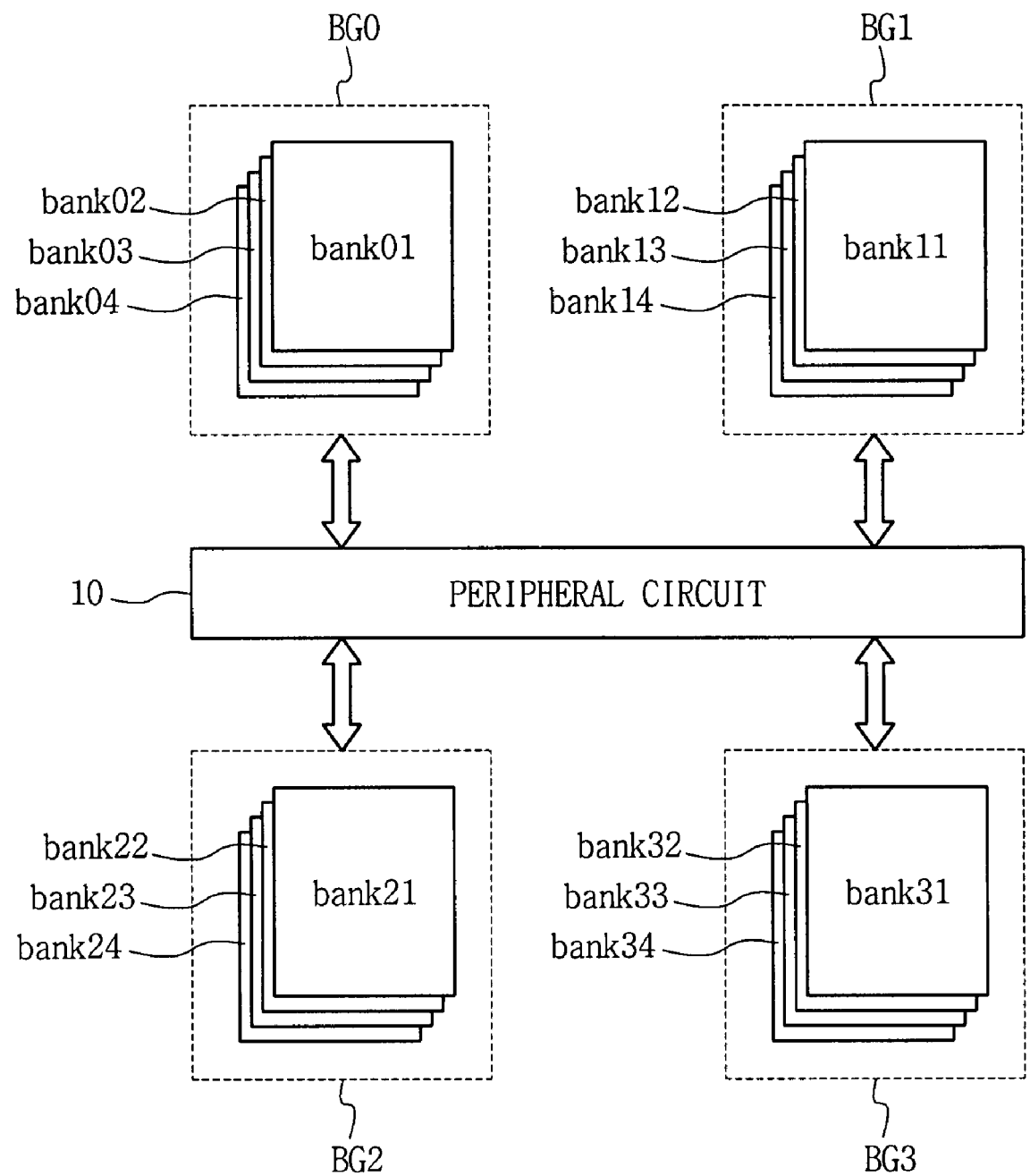
FIG. 1 is a block diagram illustrating a configuration of a conventional semiconductor memory device having conventional bank groups.

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough and complete. In the drawings, like numbers refer to like elements throughout.

Figure 3:
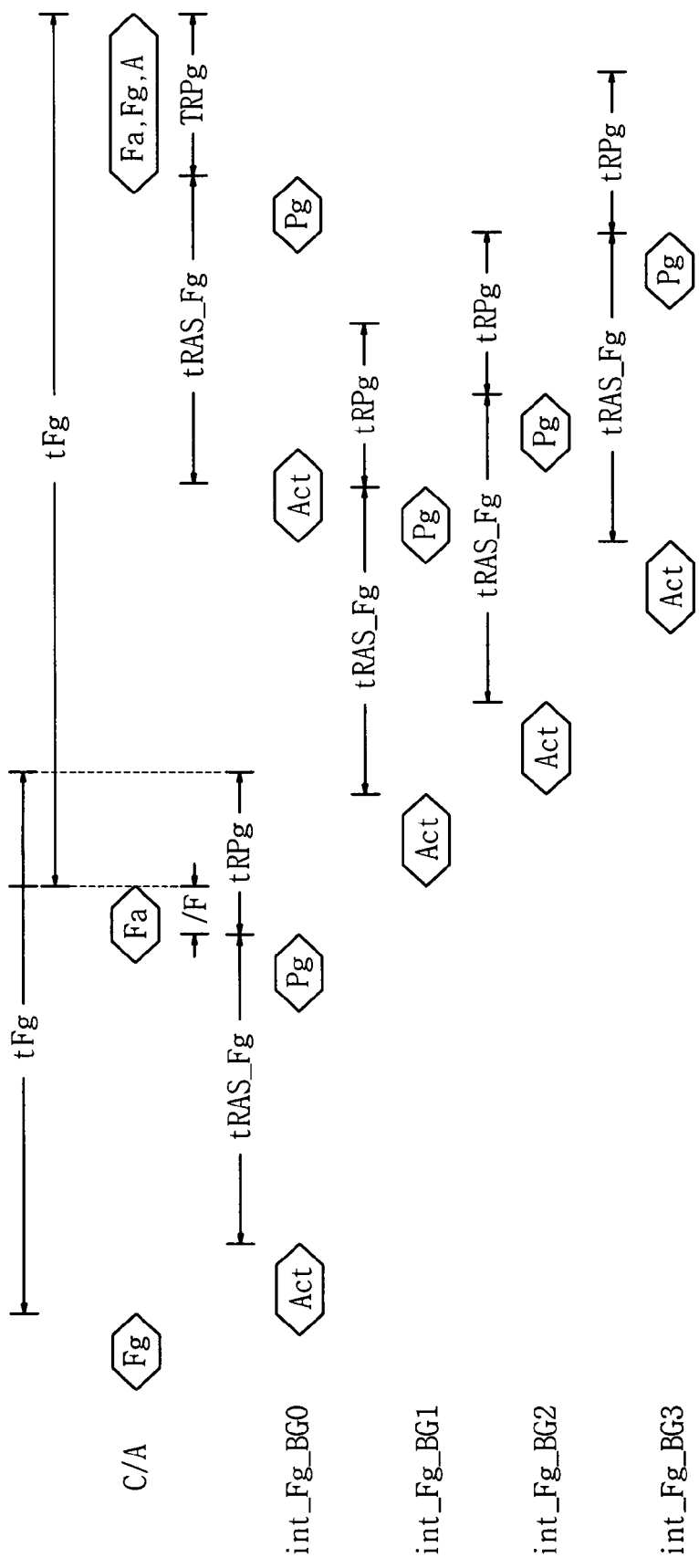
FIG. 3 illustrates a timing diagram corresponding to a refresh method and refresh operation of an example embodiment of a semiconductor memory device.

FIG. 3 illustrates a timing diagram representing an example embodiment of a refresh method and operation of an example embodiment of a refresh circuit of a semiconductor memory device. In the timing diagram of FIG. 3, a bank group refresh command Fg is applied to the semiconductor memory device, and then, an all-refresh command Fa is applied to the semiconductor memory device. In response to the bank group refresh command Fg, a bank group refresh operation for a first bank group BG0 is performed. To refresh the first bank group BG0, a bank group refresh time duration tFg may be required.

Referring to FIG. 3, if the bank group refresh command Fg is applied to the semiconductor memory device, an active command Act is applied to the first bank group BG0, and after a/RAS pulse width of bank group tRAS_Fg, a bank group precharge command Pg is applied. In response to the bank group precharge command Pg, the bank group is precharged during a bank group precharge time duration tRPg. Thus, the bank group refresh time tFg may be the time duration between a time corresponding to when the bank group refresh command Fg is applied and a time corresponding to when the precharge of the bank group is completed.

As shown in FIG. 3, according to an example embodiment, if an all-refresh command Fa is applied and the first bank group BG0 is undergoing a bank group refresh, a first bank group refresh associated with the all-refresh command Fa is first performed for the remaining bank groups, e.g., bank groups BG1, BG2, BG3, so that the first bank group BG0 completes its current bank group refresh before undergoing the another bank group refresh in response to the all-refresh command Fa.

In other words, in beginning an all-refresh operation when a bank group refresh operation is being performed on one of the bank groups, the first bank group refresh performed in response to the all-refresh command is not performed on the bank group currently undergoing the bank group refresh, but instead the first bank group refresh in response to the all-refresh command is performed for a bank group not currently undergoing a bank group refresh. For example, in FIG. 3, the first bank group refresh is performed on the second bank group BG1, the second bank group refresh is performed on the third bank group BG2, the third bank group refresh is performed on the fourth bank group BG3 and then the fourth bank group refresh is performed on the first bank group BG0, which was undergoing a bank group refresh when the all-refresh command Fa was applied.

According to an example embodiment, information on one or more bank groups may be stored. In particular, information on a bank group undergoing a bank group refresh operation is stored so that when an all-refresh command is received the stored information may be used to determine how to begin the all-refresh operation, which involves performing a plurality of bank refresh operations. As such, regarding the example shown in FIG. 3, information of the first bank group BG0 may be stored. The first bank group BG0 is undergoing a bank group refresh when the applied all-refresh command Fa is received. Accordingly, a comparison of the stored information of the first bank group BG0 and information of a bank group on which the first bank group refresh associated with the all-refresh operation is initially scheduled to be performed on in response to an all-refresh command may be used to determine, which bank group that a first bank group refresh of the all-refresh operation is performed on. In the example shown in FIG. 3, the second bank group BG1 undergoes the first bank group refresh of the all-refresh operation because the first bank group BG0 is already undergoing a bank refresh operation when the all-refresh command Fa is received.

According to an example embodiment, a refresh method for a semiconductor memory device including a plurality of bank groups each having a plurality of banks may include a bank refresh operation, a bank group information storing operation, an all-refresh command applying operation, a bank group information comparing operation and an all-refresh execution operation.

The bank refresh operation includes a refresh for at least one bank of the banks (e.g., bank01-bank03, . . . , bank31-bank33). The refresh in the bank refresh operation may be a bank group refresh, such as the refresh for the bank group BG0 illustrated in the timing diagram of FIG. 3.

The bank group information storing operation stores information of a bank group to which a bank undergoing the bank refresh belongs. For example, information for the bank group BG0 is stored in an example embodiment represented by the timing diagram of FIG. 3. The bank group information may be an address indicating the bank group. According to an example embodiment, a latch circuit or various register types of circuits may be used to store data of the bank group.

The all-refresh command applying operation applies an all-refresh command to perform a refresh for all bank groups. For example, in the timing diagram of FIG. 3, the all-refresh command applying operation applies the all-refresh command Fa to the semiconductor memory device after the bank refresh operation. In applying the all-refresh command to the semiconductor memory device, a refresh progresses in a desired and/or preset order of bank groups. The progression of the refresh operation may be dependent on the current conditions of the bank groups.

The bank group information comparing operation compares information of a bank group stored by the bank group information storing operation with information of the bank group initially scheduled to undergo a bank group refresh in response to an applied all-refresh command.

The all-refresh execution operation includes performing a refresh for a first bank group and then a refresh for the other bank groups if the comparison result of the bank group information comparing operation indicates the compared information is not equal. Further, the all-refresh execution operation includes performing a refresh for the other bank groups when the comparison result of the bank group information comparing operation indicates the compared information is equal to each other, and then a refresh for the first bank group.

As shown in FIG. 3, when the information of bank group stored in the bank group information storing step is consistent with the information of the bank group initially scheduled to undergo the first bank group refresh of an all-refresh operation, a bank group refresh for the other bank groups BG1, BG2 and BG3 are performed before the refresh for the bank group BG0 is performed.

Thus, in an example embodiment of a refresh method of a semiconductor memory device, there is an advantage of applying an all-refresh command regardless of tRPg as/RAS precharge time of bank group.

Figure 2:
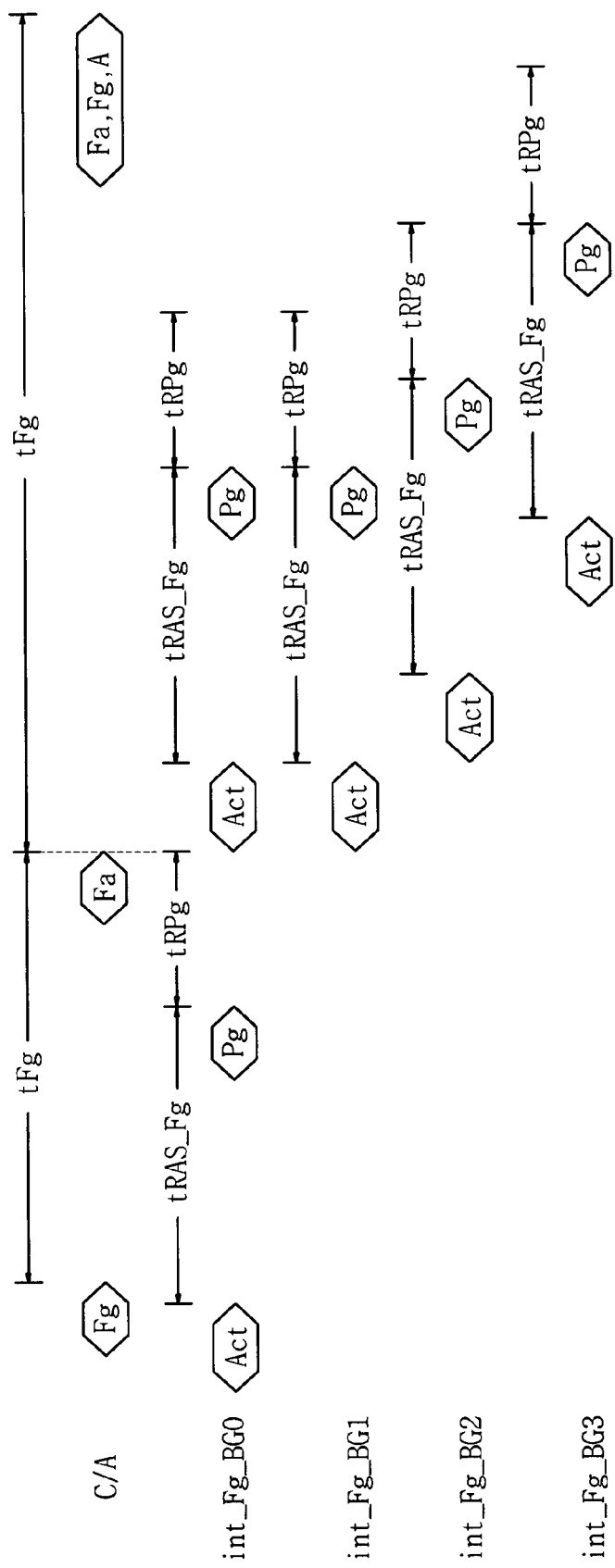
FIG. 2 illustrates a timing diagram representing a refresh operation of a conventional semiconductor memory device having the configuration of FIG. 1.

A comparison of FIGS. 2 and 3 indicates that a bank group refresh command time duration tFg must occur before the applied all-refresh command can be processed when using conventional techniques, whereas, in an example embodiment, the all-refresh command can begin being processed during a time margin corresponding to tRPg in a bank group refresh command time. As such, the applied all-refresh command may be processed quicker using an example embodiment than using conventional techniques. Although the margin corresponding to time reduced by about 1 clock cycle CLK, tRPg−1 F, is actually generated in considering internal operation, as compared with the conventional techniques a required refresh time may be reduced, thereby increasing bus efficiency according to an example embodiment.

Further, according to an example embodiment, a refresh method of the semiconductor memory device may further include storing information of a bank group that is refreshed last out of all the bank groups. For example, in FIG. 3, the information of BG0 may be stored. Like in the bank group information storing operation, the information of the bank group undergoing the final refresh may be an address of the bank group undergoing the final refresh and this information may be stored using a latch circuit and/or various types of register circuits.

An example embodiment of a refresh method of a semiconductor memory device will be described referring to the flow chart of FIG. 4.

Figure 4:
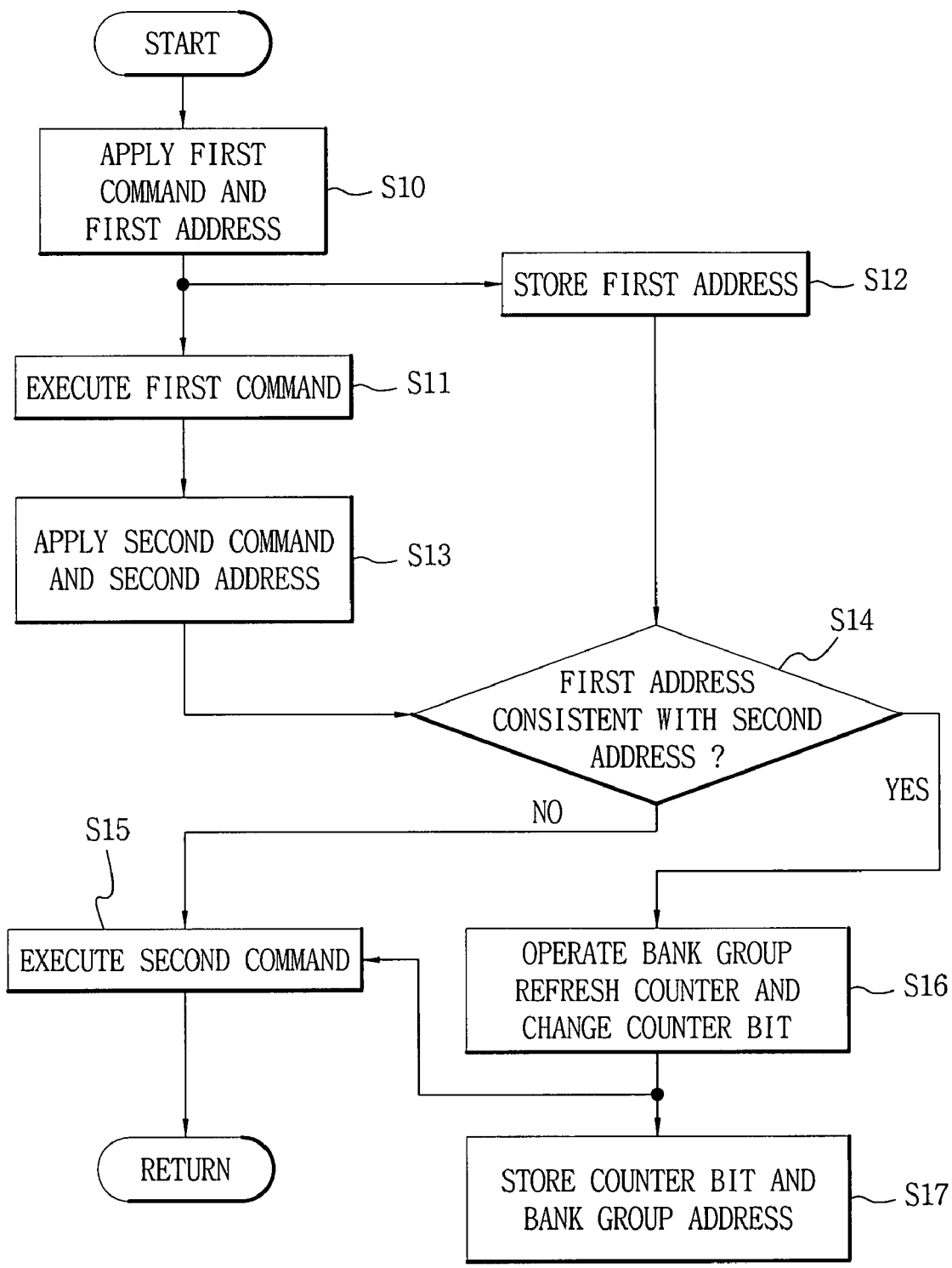
FIG. 4 is a flowchart illustrating an example embodiment of a refresh method.

The flow chart of FIG. 4 represents an example embodiment of a refresh method for a semiconductor memory device including a plurality of bank groups each having a plurality of banks. The refresh method illustrated in the flow chart of FIG. 4 includes applying a first command and a first address S10, storing the first address S12, executing the first command for a bank designated by the first address S11, applying a second command and a second address S13, comparing whether the first address is equal to the second address S14, executing the second command S15, and operating a bank group refresh counter and changing a counter bit S16 and then executing the second command S15.

An example embodiment of a refresh method of the semiconductor memory device may also include storing a counter bit and a bank group address after changing the counter bit.

The first command may be a refresh command for at least one bank, and the first address may be an address designating the at least one bank the first command is applied and/or an address designating a bank group to which the at least one bank belongs.

The second command may be a refresh command for all bank groups, that is, an all-refresh command. The second address is an address to designate a bank to which the second command is applied, and may be an address of a bank group initially undergoing a refresh.

If the comparison result of the comparison indicates two addresses are equal; a bank group refresh counter operates to change a counter bit, and then the second command for a bank group corresponding to the counter bit is executed. Alternatively, if the two addresses are not equal, the second command for the compared bank group designated by second address is executed.

As such, an example embodiment of a refresh method for a semiconductor memory device may reduce refresh time, thereby increasing bus efficiency.

An example embodiment of a refresh circuit of a semiconductor memory device is described below with reference to FIG. 5.

Figure 5:
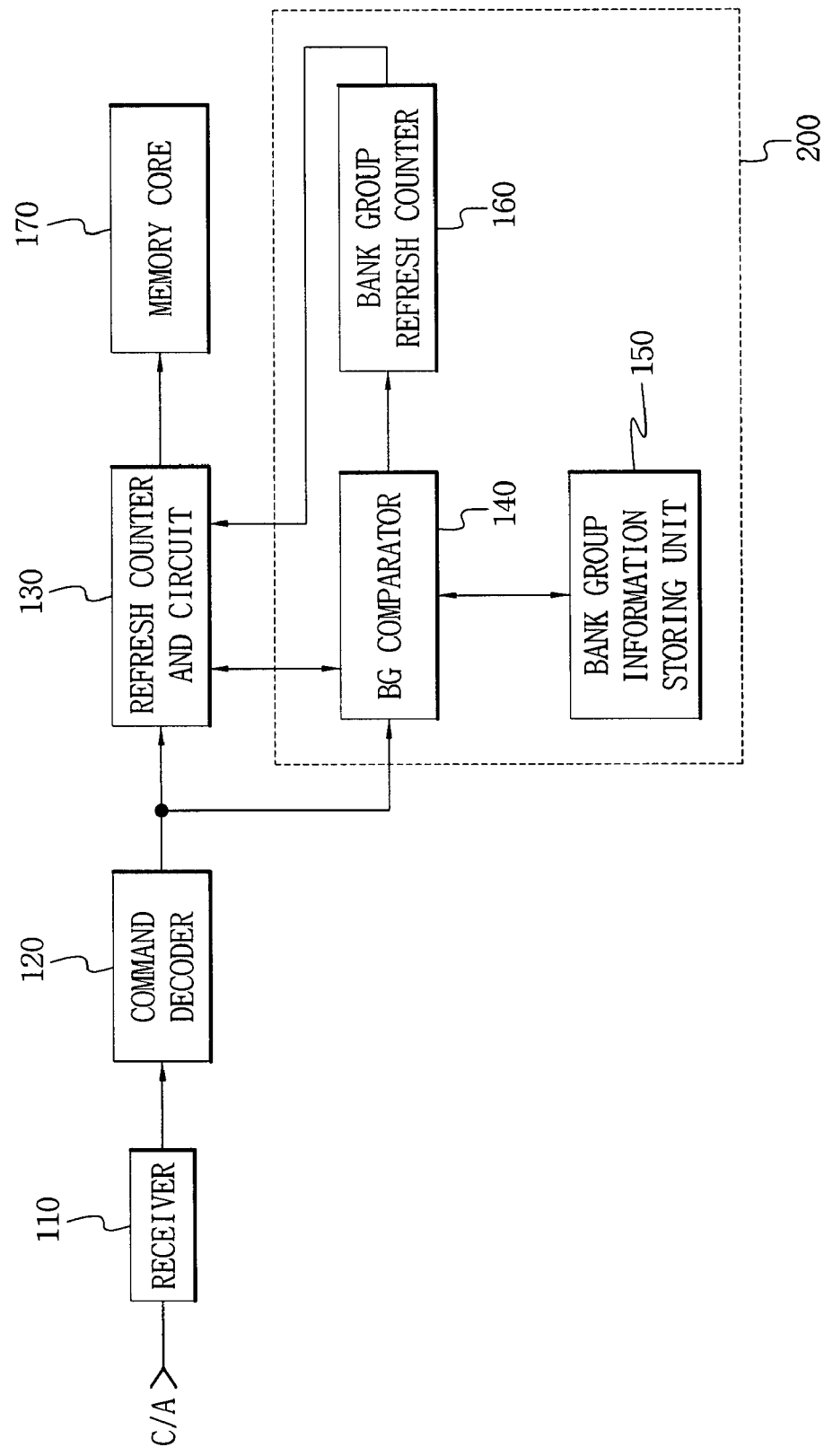
FIG. 5 is a block diagram of an example embodiment of a refresh circuit for use in an example embodiment of a semiconductor memory device.

Referring to FIG. 5, an example embodiment of a refresh circuit of a semiconductor memory device including a plurality of bank groups each having a plurality of banks, includes a refresh counter 130 and a refresh counter controller 200.

A refresh counter 130 may be allocated a value for each bank group of the plurality of bank groups. The refresh counter controller 200 controls the refresh counter 130. The refresh counter controller causes the refresh counter 130 to preserve or increase a value of the refresh counter 130. The refresh counter controller 200 may include a bank group comparator (BG comparator) 140 for comparing information of a bank group undergoing an initial refresh in the refresh for all bank groups with information of a bank group, which underwent a preceding refresh when a refresh for at least one bank is performed and then an all-refresh is performed.

If a comparison result obtained by the bank group comparator 140 indicates the information of a first bank group undergoing an initial refresh is different from the information of the bank group undergoing a preceding refresh, the refresh circuit of the semiconductor memory device performs the refresh beginning with the first bank group. Alternatively, if the information of the two compared bank groups is equal, the refresh circuit increases a value of the refresh counter and performs a refresh beginning with a bank group different from the first bank group undergoing the initial refresh.

Further, the refresh counter controller 200 may include a bank group refresh counter 160 for increasing a value of the refresh counter when the comparison result obtained by the bank group comparator 140 indicates the information of the first bank group undergoing an initial refresh is different from the information of the bank group including the bank that underwent the preceding refresh.

Still further, the refresh counter controller 200 may include a bank group information storing unit 150 for storing information of the bank group including the bank that underwent the preceding refresh. The bank group information storing unit 150 may also store information of a bank group that underwent a final refresh in the previous all-refresh. The stored information of the bank group may be an address of the bank group. The bank group information storing unit 150 may include a latch circuit and/or various types of flip flop circuits for storing the information of the bank group.

Referring to FIG. 5, a refresh command and address C/A is applied to a receiver 110. For example, the refresh command and address may be a bank refresh command and address, a bank group refresh command and address, or an all-refresh command and address. The refresh command is decoded by a command decoder 120, provided to the refresh counter and circuit 130, and then applied to a memory core 170, which includes a plurality of bank groups.

An example embodiment is now explained referring to FIG. 5 and FIG. 3. If the refresh command is a bank group refresh command Fg and a refresh for a bank group BG0 is triggered by the command Fg, the information for the bank group BG0 is stored in the bank group information storing unit 150. The information for the bank group BG0 may be an address designating the bank group BG0 as described above.

Subsequently, if an all-refresh command Fa is successively applied regardless of a specification of tRPg as a/RAS precharge time, information for a bank group, to which a refresh command will initially be applied in the execution of the all-refresh, is compared with information of bank group BG0 that underwent a preceding bank refresh, in the bank group comparator 140.

If the comparison result obtained by the bank group comparator 140 indicates the information between the bank groups is different, the refresh is applied to a memory core by the refresh circuit 130. Alternatively, if the comparison result obtained by the bank group comparator 140 indicates the information of the compared bank groups is the same, the bank group refresh counter 160 operates, the refresh circuit 130 receives information of the refresh counter 160, and performs a refresh for a bank group designated by the refresh counter 160 after the counting operation is performed.

Therefore, a total time including a bank group refresh command time tFg prior to an applied all-refresh command, a time corresponding to a period having a bank group/RAS enable time tRAS_Fg and a/RAS precharge time tRPg of conventional techniques is larger than a total time of example embodiments. Example embodiments provide an advantage by generating a margin corresponding to tRPg in the bank group refresh command time tFg prior to the applied all-refresh command. As described above, although in considering internal operation the margin corresponding to a time reduced by about 1 CLK (tRPg−1 F) is actually generated, as compared with the conventional art a refresh time is generally reduced, thereby increasing bus efficiency.

It will be apparent to those skilled in the art that modifications and variations can be made to the example embodiments described above without deviating from the spirit or scope of the invention. Thus, it is intended that the teachings of present invention cover any such modifications and variations of example embodiment provided they come within the scope of the appended claims and their equivalents. Accordingly, these and other changes and modifications are seen to be within the spirit and scope of the invention as defined by the appended claims.

What is claimed is:

1. A refresh method in a semiconductor memory device including a plurality of bank groups each having a plurality of banks, the method comprising:
    applying an all-refresh command to one of the plurality of bank groups;
    determining if the one of the plurality of bank groups includes a bank undergoing a refresh operation; and
    performing an all-refresh operation that is based on the determining in response to the applied all-refresh command, wherein
    performing the all-refresh operation includes,
        beginning the all-refresh operation with a bank group refresh of the one of the plurality of bank groups if the determining determines the one of the plurality of bank groups does not include the bank undergoing the refresh operation; and
        beginning the all-refresh operation with a bank group refresh of a bank group different from the one of the plurality of bank groups if the determining determines the one of the plurality of bank groups does include the bank undergoing the refresh operation, and
    the determining includes storing information of the bank group including the bank undergoing the refresh, and comparing the stored information with information of the one of the plurality of bank groups to which the all-refresh command is applied; and
    the performing begins the all-refresh operation with the bank group refresh of the one of the plurality of bank groups if the stored information does not match the information of the one of the plurality of bank groups to which the all-refresh command is applied, and begins the all-refresh command with the bank group refresh of a bank group different from the one of the plurality of bank groups if the stored information matches the information of the one of the plurality of bank groups to which the all-refresh command is applied.

2. The method of claim 1, wherein performing the all-refresh operation further includes storing information of a bank group undergoing a final refresh.

3. The method of claim 2, wherein the information of the bank group is an address of the bank group.

4. A refresh circuit of a semiconductor memory device including a plurality of bank groups each having a plurality of banks, comprising:
    a refresh counter having a value corresponding to each of the plurality of bank groups; and
    a refresh counter controller controlling the refresh counter to maintain a value of the refresh counter and increase the value of the refresh counter after each refresh command, wherein
    the refresh counter controller comprises a bank group comparator comparing first bank group information of a bank group including a bank undergoing a refresh operation with second bank group information of a bank group identified with an all- refresh command, and
    the refresh circuit performs an all refresh operation, the all refresh operation beginning with a bank group refresh of a bank group different from the bank group identified with the all-refresh command if a comparison result of the bank group comparator indicates the first bank group information matches the second bank group information, and the all refresh operation beginning with a bank group refresh of the bank group identified in the all-refresh command if the comparison result of the bank group comparator indicates the first bank group information does not match the second bank group information.

5. The circuit of claim 4, wherein the refresh counter controller further comprises a bank group refresh counter for increasing a value of the refresh counter if the comparison result of the bank group comparator indicates the first group information matches the second group information.

6. The circuit of claim 5, wherein the refresh counter controller further comprises a bank group information storing unit for storing information of the bank group including the bank undergoing the refresh operation.

7. The circuit of claim 6, wherein the bank group information storing unit additionally stores information of a bank group undergoing a final refresh in the all-refresh operation.

8. The circuit of claim 6, wherein the bank group information storing unit comprises a latch circuit for storing the information of the bank group.

9. The circuit of claim 4, wherein the first bank group information and the second bank group information include a bank group address.

10. A refresh method of a semiconductor memory device including a plurality of bank groups each having a plurality of banks, the method comprising:
   applying a first command and a first address to designate a bank to which the first command is applied;
   storing the first address;
   executing the first command for the bank designated by the first address;
   applying a second command and a second address to designate a bank to which the second command is applied;
   comparing whether the first address is equal to the second address;
   executing the second command when the addresses are not equal as indicated by the comparison result; and
   operating a bank group refresh counter when the addresses are equal as indicated by the comparison result, changing a counter bit, and then executing the second command for a bank group corresponding to the counter bit.

11. The method of claim 10, wherein the refresh method of the semiconductor memory device further comprises storing the counter bit and a bank group address after changing the counter bit.

12. The method of claim 10, wherein the first command is a refresh command for at least one bank of the plurality of banks.

13. The method of claim 12, wherein the first address is an address indicating a bank group including the at least one bank.

14. The method of claim 10, wherein the first command is a refresh command for one bank group.

15. The method of claim 10, wherein the second command is an all-refresh command for refreshing all banks of each of the plurality of bank groups.

16. The method of claim 15, wherein the second address is an address of a bank group undergoing an initial refresh.

* * * * *